United States Patent
Kellogg et al.

(10) Patent No.: US 12,237,142 B2
(45) Date of Patent: Feb. 25, 2025

(54) METHODS FOR DETERMINING THE VIRTUAL SOURCE LOCATION OF A LIQUID METAL ION SOURCE

(71) Applicant: FEI Company, Hillsboro, OR (US)

(72) Inventors: Sean M. Kellogg, Hillsboro, OR (US); Mostafa Maazouz, Hillsboro, OR (US); James B. McGinn, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 310 days.

(21) Appl. No.: 17/807,362

(22) Filed: Jun. 16, 2022

(65) Prior Publication Data
US 2023/0411109 A1    Dec. 21, 2023

(51) Int. Cl.
*H01J 37/09* (2006.01)
*H01J 37/22* (2006.01)
*H01J 37/24* (2006.01)
*H01J 37/244* (2006.01)

(52) U.S. Cl.
CPC ............ *H01J 37/09* (2013.01); *H01J 37/226* (2013.01); *H01J 37/244* (2013.01); *H01J 2237/0458* (2013.01); *H01J 2237/221* (2013.01); *H01J 2237/2443* (2013.01); *H01J 2237/2445* (2013.01)

(58) Field of Classification Search
CPC ........ H01J 37/09; H01J 37/226; H01J 37/244; H01J 2237/0458; H01J 2237/221; H01J 2237/2443; H01J 2237/2445
See application file for complete search history.

(56) References Cited

U.S. PATENT DOCUMENTS

| | | |
|---|---|---|
| 2001/0010362 A1 | 8/2001 | Simizu |
| 2006/0243906 A1* | 11/2006 | Fukada ............... H01J 37/28 250/311 |
| 2012/0205539 A1* | 8/2012 | Hlavenka ............ H01J 37/224 250/307 |
| 2017/0154752 A1 | 6/2017 | Essers et al. |
| 2021/0035775 A1 | 2/2021 | Straka et al. |
| 2024/0272312 A1* | 8/2024 | Mangnus ........... G01T 1/20182 |

FOREIGN PATENT DOCUMENTS

| | | |
|---|---|---|
| EP | 1271604 A1 | 1/2003 |
| EP | 2088614 A1 | 8/2009 |
| WO | 03032351 A2 | 4/2003 |

OTHER PUBLICATIONS

Extended European Search Report pursuant to Rule 62 EPC from European Application No. 23178069.3-1212 / 4293699, dated Nov. 21, 2023, 13 pages.
Jacob et al., "Transmission Microscopy with Nanometer Resolution Using a Deterministic Single Ion Source," Physical Review Letters, vol. 117, No. 4, 6 pp. (Jul. 2016).

* cited by examiner

*Primary Examiner* — Nicole M Ippolito
(74) *Attorney, Agent, or Firm* — Klarquist Sparkman, LLP

(57) ABSTRACT

Variations in charged-particle-beam (CPB) source location are determined by scanning an alignment aperture that is fixed with respect to a beam defining aperture in a CPB, particularly at edges of a defocused CPB illumination disk. The alignment aperture is operable to transmit a CPB portion to a secondary emission surface that produces secondary emission directed to a scintillator element. Scintillation light produced in response is directed out of a vacuum enclosure associated with the CPB via a light guide to an external photodetection system.

20 Claims, 8 Drawing Sheets

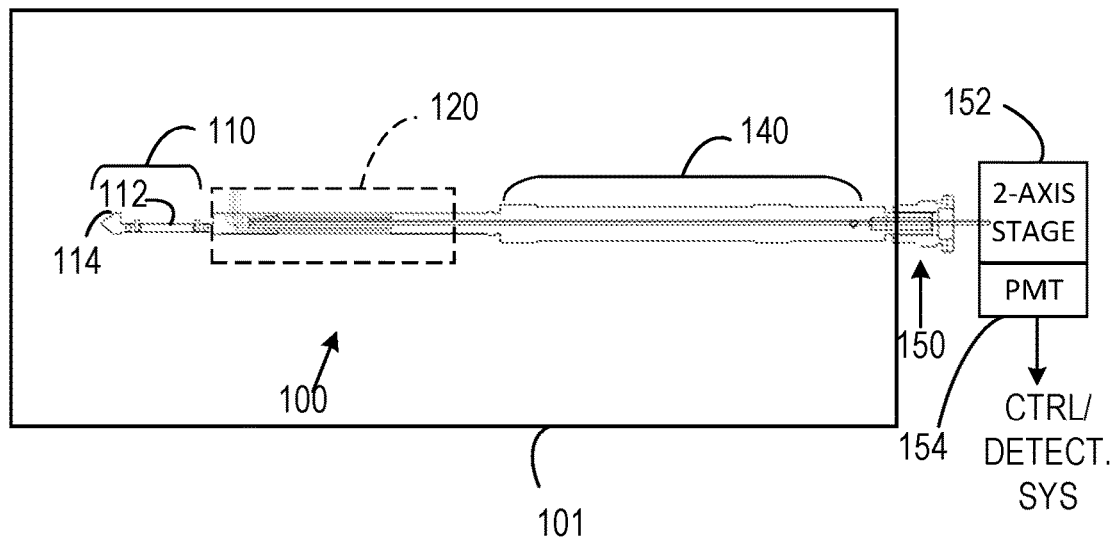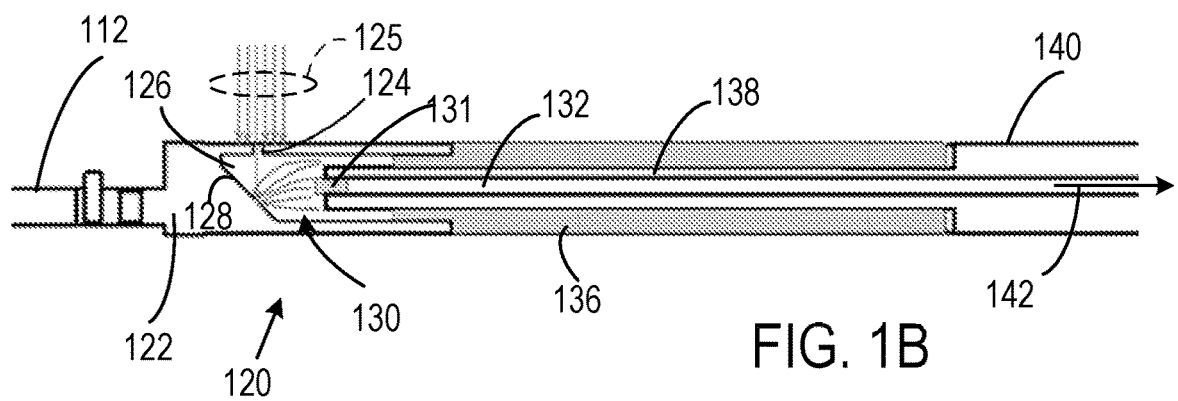

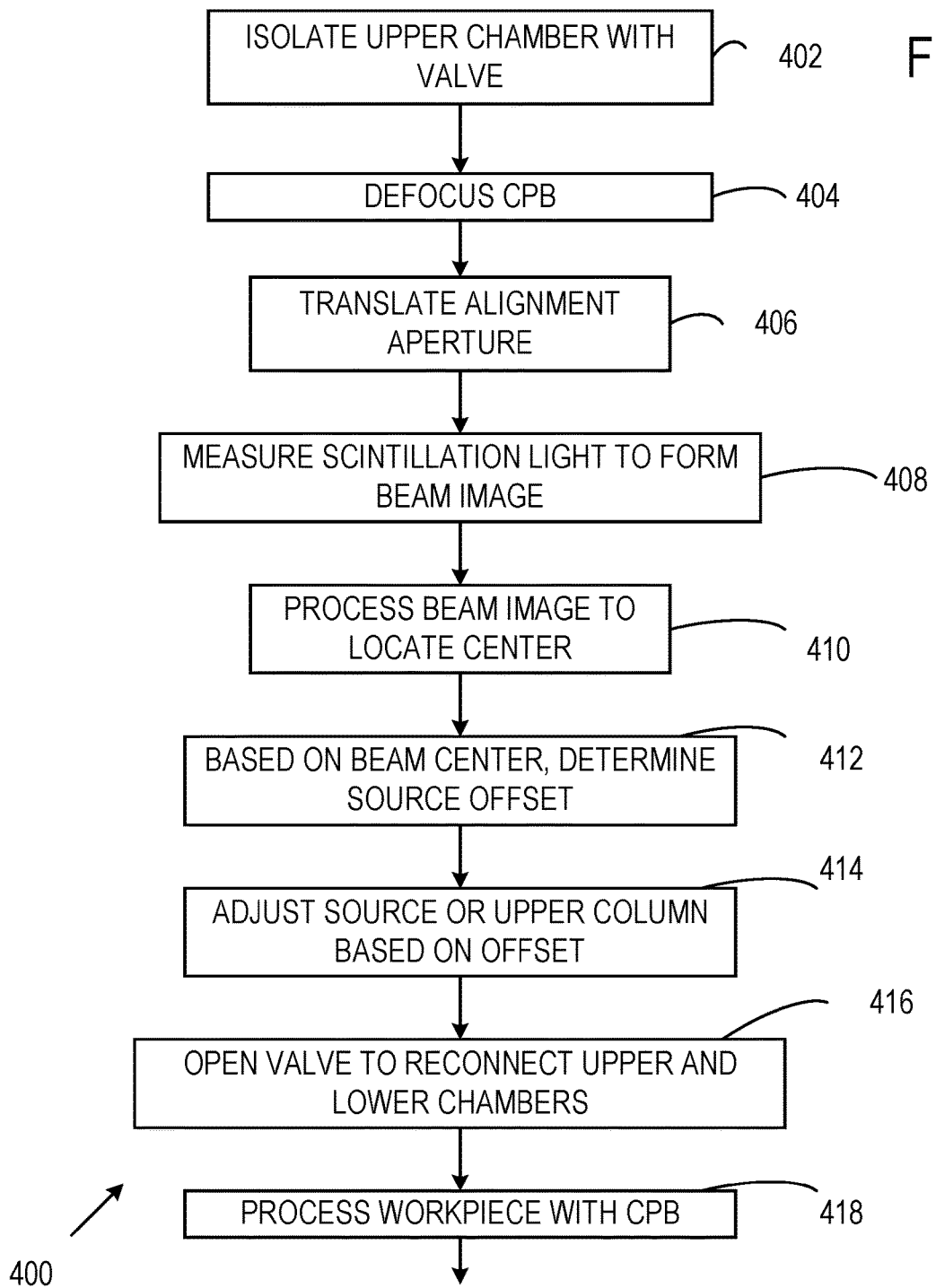

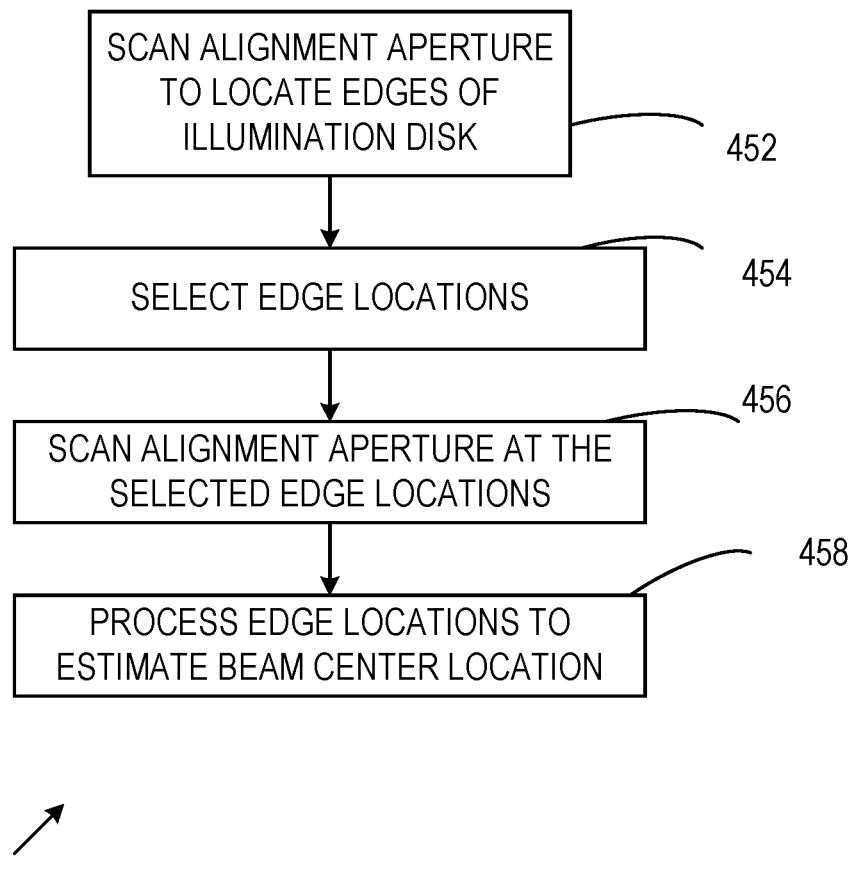
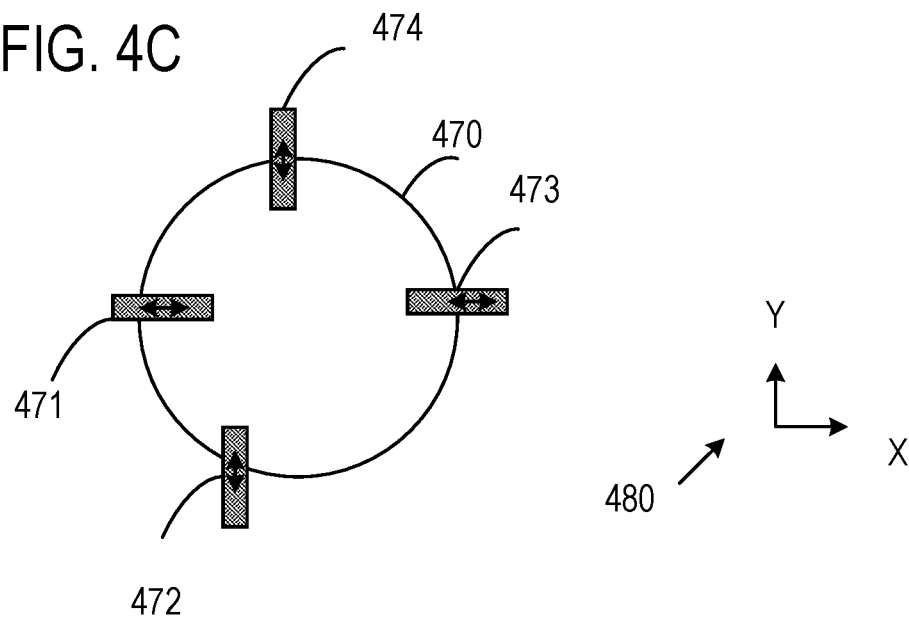

METHODS FOR DETERMINING THE VIRTUAL SOURCE LOCATION OF A LIQUID METAL ION SOURCE

FIELD

The disclosure pertains to focused ion beam systems.

BACKGROUND

Focused ion beams (FIBs) can be directed to workpieces for workpiece evaluation, repair, and fabrication. For many applications, high beam intensities are preferred to reduce processing time and increase throughput. Liquid metal ion sources (LMISs) are especially attractive for generating FIBs due to the high beam currents that can be produced. Unfortunately, ion beam emission from LMISs tends to be produced at emission regions whose position varies in time. Thus, a properly aligned ion beam source will generally become misaligned. While an FIB optical column can be disassembled for realignment, such disassembly can be time consuming and requires venting of a vacuum chamber that contains the LMIS and the FIB optical column. After realignment and reassembly, the vacuum chamber must be evacuated before use. During this time, the FIB instrument is not available for use. Moreover, venting can also permit contamination which must be eliminated before use. Alternative approaches are needed for aligning beam sources in charged-particle-beam systems.

SUMMARY

Charged particle beam alignment apparatus, include an alignment aperture plate defining an alignment aperture and a secondary emission element situated to receive a portion of a charged particle beam (CPB) transmitted by the alignment aperture and operable to produce secondary emission in response. A scintillator element is situated to receive at least a portion of the secondary emission and produce scintillation light in response. A photodetector receives the scintillation light produced at the scintillator element. By moving the alignment aperture and detecting the scintillation light with the photodetector, a CPB axis can be located so that movement of the source can be compensated. In some example, the scintillation light coupled out of a vacuum enclosure with a light guide so that the photodetector is not within the vacuum enclosure.

The foregoing and other features, and advantages of the disclosure will become more apparent from the following detailed description, which proceeds with reference to the accompanying figures.

BRIEF DESCRIPTION OF THE DRAWINGS

FIGS. 1A-1B illustrate a representative alignment apparatus.

FIG. 4A illustrates a representative alignment method.

FIG. 4B illustrates another representative alignment method.

FIG. 4C illustrates alignment aperture scans used in the method of FIG. 4B.

DETAILED DESCRIPTION

Figure 2:
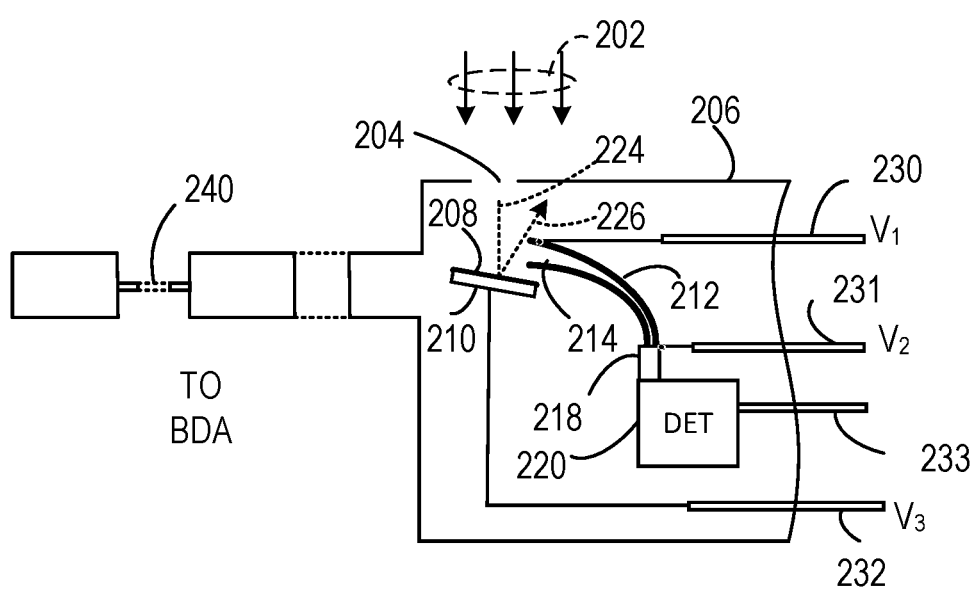
FIG. 2 illustrates a portion of another representative alignment apparatus.

The disclosed methods and apparatus are directed to measuring a source location (either real or virtual) of a liquid metal ion source (LMIS) or other ion source so that ion beam optics provided in an ion beam column or an ion source position can be adjusted to maintain alignment. In some examples, such measurements are made periodically or upon demand. In some cases, the ion source is repositioned to a previously established location while in other cases, drive levels such as voltages applied to a charged-particle beam (CPB) optical column are adjusted to compensate for measured ion source position. Repositioning the ion source to a previously established location permits ion beam alignment in a simple and straightforward procedure.

General Terminology

As used herein, an ion beam column, an electron beam column, or other charged-particle-beam (CPB) column is defined as one or more CPB optical elements such as electrostatic or magnetic lenses, beam deflectors, beam defining apertures, stigmators, apertures, or other beam shaping and beam direction elements. In the examples, a charged particle beam (CPB) column is sometimes divided into two or more parts. It is convenient to describe the CPB column as including an upper column in which charged particles from a source are shaped into a CPB using one or more optical elements that can include one or more condenser lenses, stigmators, beam deflectors, and apertures. A lower column can include one or more lenses, stigmators, beam deflectors, and apertures and is generally configured to shape and direct a CPB received from the upper column to a workpiece. In some examples, a lower column focuses the CPB to a spot of a selected size at a selected location on a workpiece. The CPB column is situated with a vacuum enclosure that can define an upper chamber and a lower chamber in which the upper column and lower column, respectively, are situated. The upper chamber and the lower chamber can be separated with an isolation valve so that, for example, the upper column can remain operational during workpiece exchange in the lower chamber. This can reduce upper chamber contamination, pump-down times, and permits measurement and adjustment of the upper column during workpiece exchange.

As used herein, an Everhart-Thornley (ET) detector is an electron detector that includes a scintillator material that is coupled to a lightguide so that scintillation (referred to herein generally as scintillation light) produced by charged particles at the scintillator material is at least partially directed to the lightguide for propagation to a photodetector. In the disclosed examples, ET detectors can include plastic or glass lightguides, hollow lightguides, optical fibers of plastic or glass, or other lightguides. Typical lightguides are depicted as having circular cross-sections but cross-sections can be elliptical, ovoid, square, polygonal or other shapes. Circular cross-sections are convenient for manufacturing and such light guides are widely available. Scintillator materials such as ceramic scintillators or dielectric scintillators such as plastic scintillators, alkali halides such as NaI(Tl), CsI(Tl), CsI(Na), LiI(Eu), other inorganic materials such as BGO, CdWO4, ZnS(Ag), cerium-activated inorganics such as GSO, YAP, YAG, LSO, LuAP, LaBr, organic crystals such as anthracene can be used. Other types can also be used as may become necessary. Scintillator elements can be provided as cylinders, cubes, sheets, discs, plates, powders, crystal sections, particles, or other regular or irregular shapes or combinations of shapes as convenient and can be secured to or fixed with respect to a light guide to couple scintillation light to a photodetector. In some examples, a scintillator element can be shaped as an extension of a light guide and secured to the light guide. Photodetectors such as photodiodes, avalanche photodiodes, photomultipliers, or others can be used. A scintillator element is generally situated in a Faraday cage and a bias can be applied so that secondary emission is directed to the scintillator element.

An aperture plate is a member that is used to define an aperture that is transmissive to a CPB. Aperture plates are conveniently metallic with a suitable CPB transmissive aperture. In CPB systems, conductive aperture plates are preferred and if non-conductive materials are used, such aperture plates can be provided with a conductive coating. Aperture plates can be provided on a surface of a container such as a metallic container that forms a Faraday cup (or a portion of a Faraday cup) for collection of incident charged particles transmitted by the associated aperture. Circular apertures are commonly used, but other shapes can be used as well. Aperture plates generally have thicknesses that are less than an effective diameter or other cross-sectional dimension of the associated aperture. Apertures that shape a beam (typically in a lower column) for delivery to a workpiece are referred to herein as beam defining apertures (BDAs) for convenience; apertures situated for beam formation (typically in an upper column) based on emission from a beam source are referred to herein as beam forming apertures (BFAs) for convenience. In typical CPB systems, a BFA is used in conjunction with one or more CPB lenses to form a CPB that is directed to a BDA and then scanned, focused, or otherwise delivered to a workpiece or other target.

As used herein, a secondary emission element is an object having a surface situated to receive a CPB and produce secondary emission in response. A secondary emission surface can be provided by a layer or coating that is selected generally to enhance secondary emission in response to a particular beam type and energy at the secondary emission element. In some cases, a bias can be applied so that the CPB is incident to the secondary emission surface at a suitable beam energy to enhance secondary emission. A secondary emission element can be a plate or other shaped conductor or be provided as a surface of a container, such as a conductive container that forms a Faraday cage.

ET detectors or portions thereof are defined in support members that are configured to provide or support one or more BDAs for a CPB optical column and an alignment aperture that has a fixed offset with respect to the one or more BDAs along with a secondary emission surface and a scintillator element. The alignment aperture can be used to locate a center or other feature of a focused, unfocused, or partially focused CPB. Based on the determined location and the fixed offset, suitable adjustments to a beam forming portion of a CPB optical column (typically the upper column) can be adjusted. The support member is generally an elongated member having a length L and an effective cross-sectional area A that defines an effective width w as w=sqrt(A) such that a ratio L/w is at least 2, 5, 7.5, or 10. A support member can have a generally cylindrical shape or other shape or combination of shapes. In typical examples, support members include one or more sections. An inner section is operable to receive a CPB and in some examples, a section includes or supports one or more BDAs when situated for use; such as section is referred to herein as being situated at an inner end. A section that is situated at or closest to a vacuum enclosure wall is referred to as an outer section or at an outer end. The outer end generally retains a light guide portion that transmits scintillation light to a detector external to a vacuum enclosure and is coupled to a mechanical vacuum feed-through that is operable to move apertures provided by or on a more interior section with respect to a CPB axis.

As used herein, image refers to a data array containing measured values of CPB intensity at a plurality of locations. Typically, such arrays are two dimensional but other kinds of arrays can be used. Such arrays are typically stored in one or more computer-readable storage devices such a memory devices or disk drives. The control systems used herein can be based on microcontroller circuits or other logic devices such as gate arrays.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation. For example, the terms upper and lower column do not imply a particular spatial orientation of CPB optics.

Alignment Assembly with Light Guide

Referring to FIGS. 1A-1B, an alignment apparatus 100 for a CPB system includes a support member having a beam defining aperture (BDA) extension 110 situated at an inner end, a detector portion 120, a positioning arm 140 situated at an outer end, and a vacuum feed-through 150. The positioning arm 140 is coupled to an actuator 152 shown as a 2-axis stage that permits motion of the positioning arm 140, the detector portion 120, and the BDA extension 110 with respect to a charged-particle beam (CPB) 125, typically a focused ion beam (FIB). In operation, the vacuum feed-through 150 is operable to permit 2-axis motion of the alignment apparatus 100 with respect to the CPB 125 while situated in a vacuum chamber 101.

In this example, the BDA extension 110 includes a distal portion 114 configured for electrical contact within the vacuum chamber 101 to establish a bias voltage. The BDA extension 110 has a portion 112 in which one or more BDAs are defined. BDA apertures are generally situated to transmit an incident CPB in use and can be defined on a BDA aperture plate that includes multiple apertures so that a degraded BDA can be replaced with another BDA while maintaining vacuum.

The detector portion 120 includes a detector housing 122 that defines an alignment aperture 124 and a detector volume 126 that form a Faraday cup. As shown, the alignment aperture 124 is situated to transmit a portion of an incident CPB 125 into the detector volume 126. The detector housing 122 and the alignment aperture 124 are translatable with respect to the CPB beam 125 with the actuator 152. The portion of the CPB 125 transmitted by the alignment aperture 124 is incident to a secondary emission element formed as a secondary emission surface 128 at which secondary electrons 130 are produced in response to the transmitted beam portion. The alignment aperture 124 is generally a circular aperture, but other shapes can be used. A scintillator element 131 is situated to receive at least some of the secondary electrons 130 and produce scintillation light 142 that is directed by a light guide 132 to a photomultiplier (PMT) 154 or other photodetector such as an avalanche photodiode or other detector. The light guide 132 can be a glass or plastic optical fiber, a transparent rod of plastic, glass, or other transmissive material, or a cavity defined in a conductive inner sleeve 138 that extends between the scintillator element 131 and the vacuum feed-through 150. An insulating sleeve 136 couples the detector housing 122 to the positioning arm 140 so that the detector housing 122 and the positioning arm 140 can be set to different voltages.

In this example, the BDA extension 110 is typically biased a few kV below the potential of the scintillator element 131 (for example, at −1 kV to −5 kV) so that the secondary electrons 130 are directed to the scintillator material 131. In addition, the positioning arm 140 and the conductive inner sleeve 138 are maintained at or near ground potential to simplify construction of the vacuum feed-through 150. To reduce charging, the scintillator element 131 can be a conductive material such as a ceramic scintillator material or a dielectric scintillator material such as a plastic scintillator that is provided with an electron transmissive conductive coating. The secondary emission surface 128 can be an interior surface of the detector volume such as an aluminum or other metallic surface, or a coating can be applied to enhance secondary emission. It is generally preferable that a direction of incidence of a CPB through the alignment aperture 124 does not correspond to an angle of reflection of the CPB to the scintillator material 131 to reduce debris build-up the scintillator element 131.

As shown in FIGS. 1A-1B, a BDA and an alignment aperture need not be situated in a common plane; the portion 112 in which one or more BDAs are defined is offset from the alignment aperture 124 along an axis of the CPB column which is generally parallel to a Z-axis with CPB offsets measured along an X-axis and a Y-axis of a coordinate system 170.

Alignment Assembly with Electron Multiplier

FIG. 2 is a schematic drawing of a representative alignment apparatus 200 that includes an alignment aperture 204 defined in an interior portion 206 of a support member. The alignment aperture 204 is situated to transmit a portion of a CPB 202 to a secondary emission surface 208 that is provided on a base 210. An electron multiplier 212, shown as a continuous dynode electron multiplier, is situated to receive secondary electrons produced at the secondary emission surface 208. In this example, the continuous dynode electron multiplier 212 is shown as horn-shaped with an entrance aperture 214. Other electron multipliers could be used such as discrete dynode electron multipliers or microchannel plate multipliers. In FIG. 2, the alignment apparatus 200 is shown as moved so that the alignment aperture 204 receives the CPB 202; in normal operation, the alignment apparatus is moved so that the CPB 202 is directed to a BDA 240.

The electron multiplier 212 is coupled to a scintillator element 218 that is situated to couple scintillation light to a photodetector 220. In this example, the transmitted portion of the CPB 202 propagates along an axis 224 to the secondary emission surface 208. The secondary emission surface 208 is oriented so that specular reflection of the incident CPB beam portion propagates along an axis 226 to avoid coupling into the entrance aperture 214 of the electron multiplier 212. One or more vacuum electric feedthroughs such as feed-throughs 230-233 (illustrated schematically) are provided to couple operating potentials V1, V2, V3 for biasing the electron multiplier 212, inhibiting charge build-up on the scintillator element 218, establishing a secondary emission surface voltage, and communicating with the photodetector 220 into the vacuum chamber and to couple a detected light signal out of the vacuum chamber. The feed-throughs 230-233 are generally configured to permit mechanical positioning of the BDA 240 and the alignment aperture 204 with respect to the CPB 202. In this example, a photodetector is provided at the scintillator element 218 but it is typically more convenient to couple scintillation light to a light guide that delivers scintillation light to an external photodetector.

Focused Ion Beam (FIB) System

Figure 3:
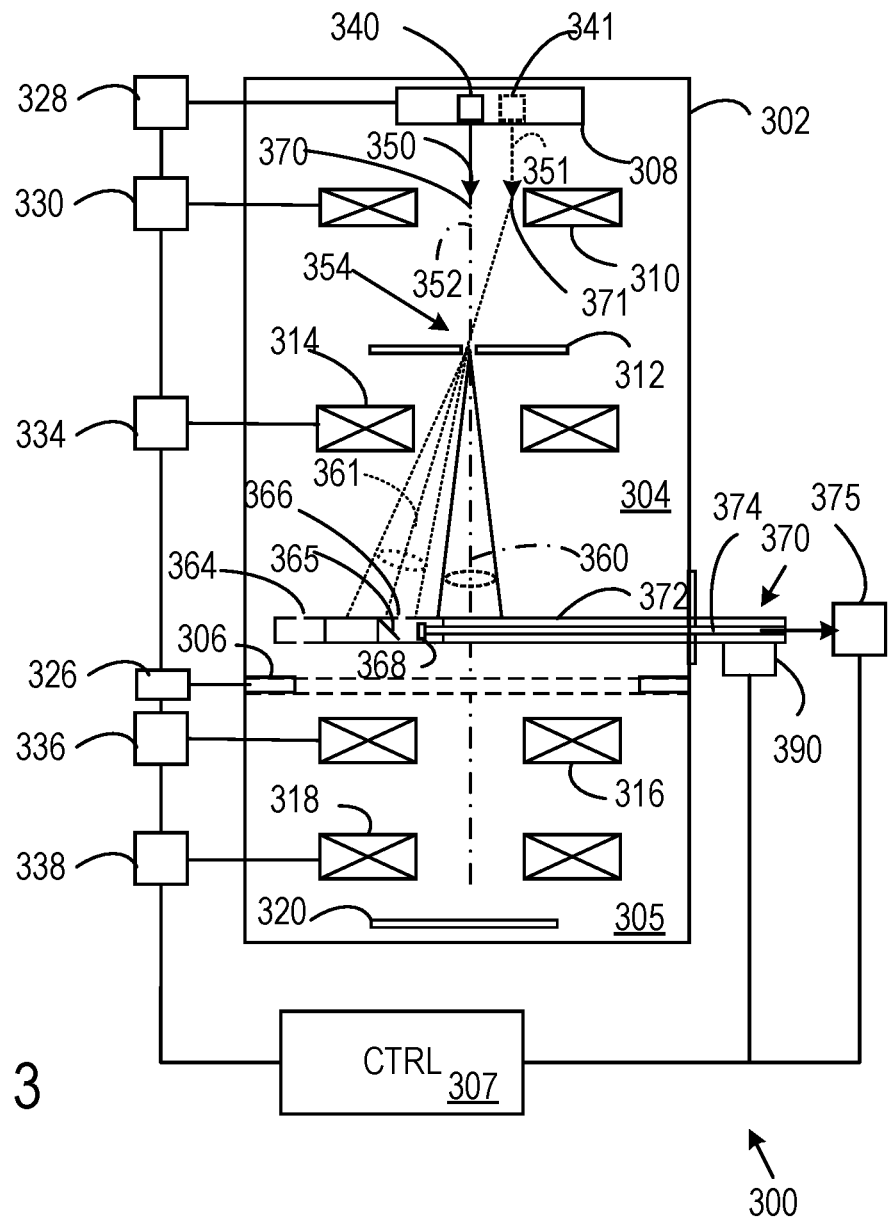
FIG. 3 illustrates a representative focused ion beam (FIB) system that includes an alignment apparatus.

Referring to FIG. 3, a representative FIB system 300 includes a vacuum enclosure 302 that defines vacuum chamber comprising an upper chamber 304 and a lower chamber 305 that can be separated by a valve 306 that is operable with an actuator 326 in response to a controller 307. An ion source 308 such as a liquid metal ion source is situated to direct an ion beam to an upper optical column that includes CPB lenses 310, 314 and a beam forming aperture (BFA) 354 defined in an aperture plate 312. A lower optical column includes lenses 316, 318 that direct a FIB to a workpiece 320. In some examples, an additional CBP column such as an electron beam column is provided for e-beam imaging of the workpiece 320 but is not shown in FIG. 3. The lenses 310, 312, 316, 318 are coupled to respective power supplies 330, 334, 336, 338 that supply currents or voltages for lens operation in response to the controller 307. A power supply 328 can establish operating conditions for the ion beam source 308. In use, the CPB lens 314 is generally operated to focus a CPB through a beam defining aperture (BDA) 364; during alignment, the CPB can be unfocused or less focused to provide an illumination disk.

An alignment apparatus 370 includes a support member 372 that defines a beam limiting aperture 364 which is used in normal operation and an alignment aperture 366 that is fixed with respect to the beam limiting aperture 364 and transmits portions of a CPB to a secondary emission surface 365. Secondary emission received by a scintillator element 368 produces scintillation light that is coupled to a light guide 374 and to a photodetector system 375.

The ion source 308 has an ion emission region 340 that is situated to direct an ion beam 350 along an axis 352. In operation, the ion emission region 340 moves as shown as an ion emission region 341 which can be displaced from the original ion emission region 340 in directions transverse to or along the axis 352. The ion emission regions 340, 341 produce respective beams that are directed along axes 360 (in this case, this is the same as the original beam axis 352), 361, respectively, from virtual source locations 370, 371 which can be dependent on CPB properties of an optical column. In some examples, virtual source locations correspond to actual locations of the original and displaced emission regions 340, 341 but generally correspond to emission regions as imaged by portions of an upper optical column. In operation, the ion beam is directed through a beam forming aperture 354; as shown the axis 362 is tilted with respect to the axis 360 and displaced from the axis 360 at a plane containing the BDA 364. As shown, the lens 314 can be operated so that beams formed at or near a plane of the BDA 364 are not focused to provide an illumination disk instead of a focused beam. Alternatively, the CPB can be focused as or near the plane containing the BDA 364. Using the alignment apparatus 370, a position of the axis 361 and the associated CPB can be found, with either a CPB illumination disk or a focused CPB. In some cases, a pixelated CPB detector can be used and scanning of the alignment aperture 366 is not needed. An actuator 390 is operated to translate support member 372 and based on detected scintillation light, a shape, size, and position of the CPB associated with the ion emission region 341 can be determined using instructions executed by a controller 307 such as microprocessor or other logic device and the optical column can be suitably adjusted. In some cases, adjustments are made to so that the axis 361 is substantially the same as the axis 360.

Representative Alignment Methods

Referring to FIG. 4A, a representative method 400 includes isolating an upper chamber of CPB system with an isolation valve at 402, if desired, so that alignment can be done while a workpiece is being changed and vacuum need not be maintained in a lower chamber. At 404, the CPB can be defocused at or near a BDA plane to form a CPB illumination disk. At 406, an alignment aperture is translated in the defocused CPB and scintillation light produced in response to secondary emission resulting from transmitted portions of the CPB is measured at 408. The measured scintillation light can be stored as a beam image and the stored beam image processed to locate a beam center in one or more directions at 410, typically in directions transverse to a beam propagation axis. With the beam center located, a CPB offset can be determined at 412 and a source location or the upper column can be adjusted at 414. For example, one or more beam deflectors can be used to establish a propagation axis aligned with the upper column and the BDA centered on this axis, or a beam source can be translated. After adjustment, the alignment process can be repeated for verification. If the upper chamber is isolated at 402, the isolation valve can be opened at 416 and a workpiece processed at 418. It can be convenient to perform the alignment method using computer-executable instructions provided to a logic processor such as a microprocessor during workpiece exchange. With this approach, automatic source alignment can be addressed without venting the vacuum chamber, reducing processing time lost to alignment procedures.

It is generally preferable to emphasize measurement of beam current at edges of an illumination disk. Referring to FIG. 4B, at 452 an alignment aperture is scanned (coarse/rapid scanning is generally sufficient) to location edges of the illumination disk. At 454, edge locations are selected and at 456, the alignment aperture is scanned at the selected edge locations. At 458, the edge location scans are used to find a beam center by, for example, using a fitting procedure such as a non-linear least squares fitting procedure to a circle. In some cases, ellipses or other shapes can be used to represent the illumination disk and used in the fitting.

Figure 4D:
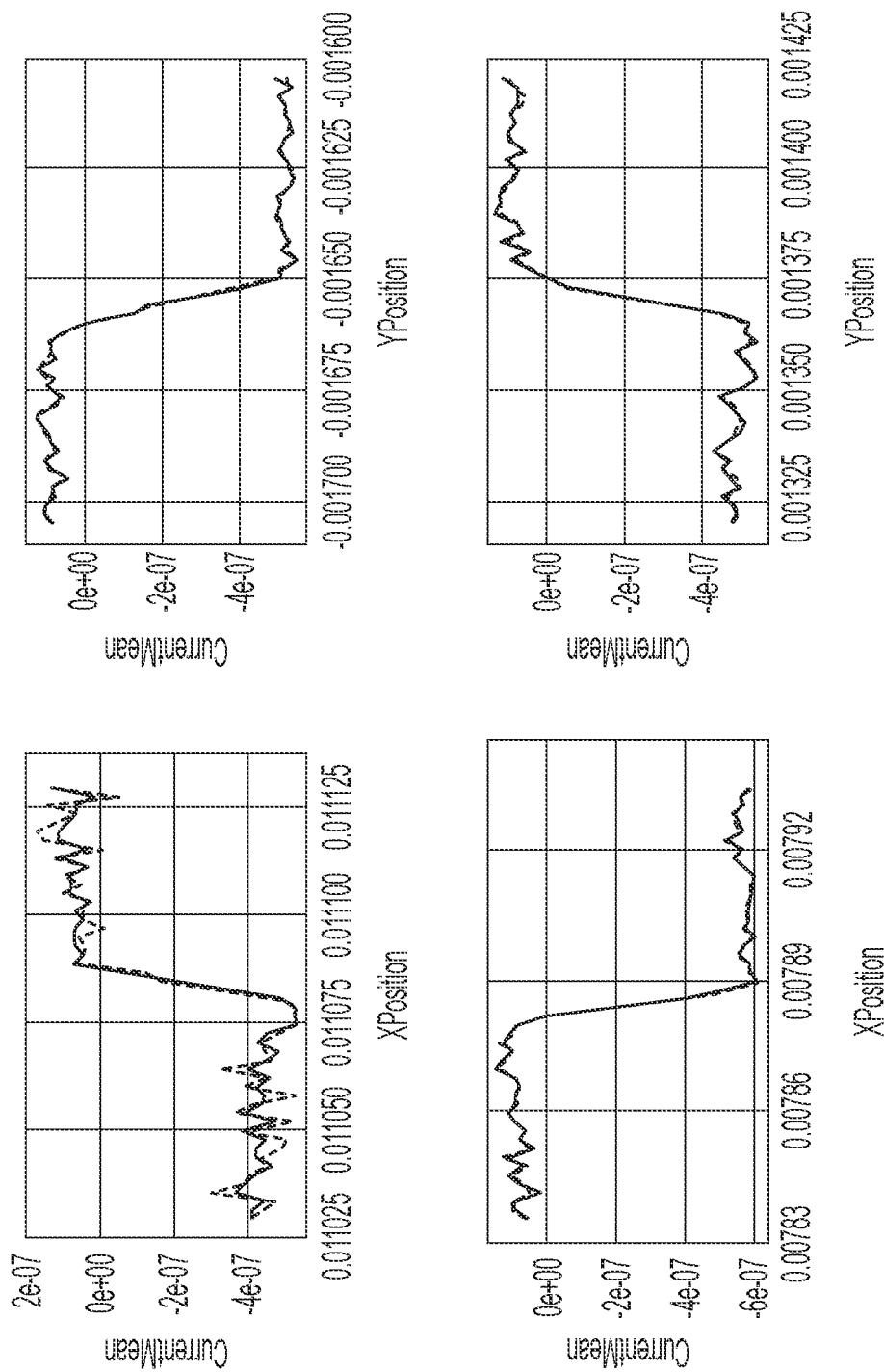
FIG. 4D illustrate graphs of beam intensity as a function of scan position associated with scan areas as illustrated in FIG. 4D.

FIG. 4C illustrates such edge scanning. Upon location of the illumination disk 470, edge regions 471-474 are selected, and the alignment aperture is scanned at each to obtain beam current as a function of alignment aperture position that can be established using mechanical stage. FIG. 4D illustrates transmitted beam current as a function of position for representative scans based scintillation light detected with a photodetector. The edge regions 471, 473 are used in X-scans and edge regions 472, 474 are used in Y-scans in a coordinate system 480. Other edge regions can be selected and, in some cases, an edge region is scanned in a direction other than an X-direction or a Y-direction.

In another approach, a Bayesian measurement method is used. In such an approach, a prior probability distribution ("prior") is selected based on typical beam characteristics or an arbitrary selection. The beam is sampled as discussed above, and the sample measurements used to update the prior. The sampling/updating process is continued until a target accuracy is obtained.

Figure 5A:
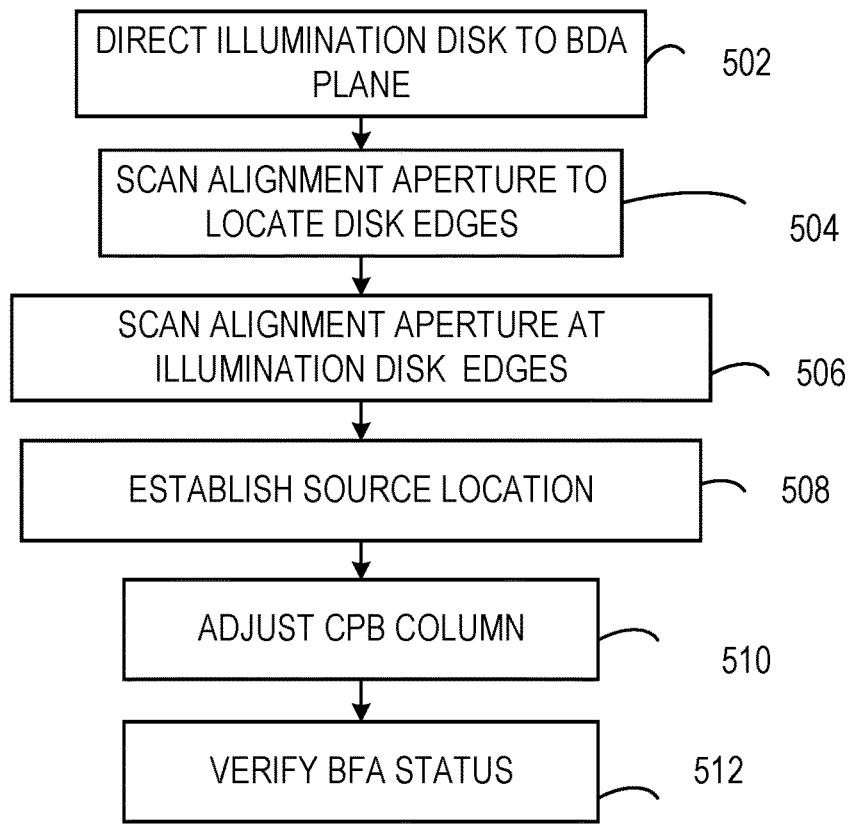
FIG. 5A illustrates an alignment method based on detecting edges of an illumination disk.

Referring to FIG. 5A, a method 500 includes directing a CPB illumination disk to a plane such as a plane in which a BDA is situated at 502. An alignment aperture as described above is scanned with respect to the CPB illumination disk at 504 to locate edges, typically along at least two non-parallel axes. This scan be associated with selected number of measurement locations that are separated by fixed, irregular, periodic, or other intervals. In central portions of the CPB illumination disk, illumination levels typically do not vary substantially and measurement of the CPB illumination disk at beam edges is preferred for establishing CPB illumination disk location. Based on the scan of the CPB illumination disk with the alignment aperture to location illumination disk edges, at 506, the alignment aperture is then scanned about illumination disk edges and at 508, a location of an ion beam source is determined. The ion beam source location can be a real ion beam source location or a virtual location established by one or more elements of a CPB optical column. For example, an offset of a center of the CPB illumination disk from an intended CPB column axis or a previous location can be determined.

A lateral offset of the illumination disk can correspond to an offset of the ion beam source as shown in FIG. 3. Based on this offset, one or more portions of a CPB column can be adjusted at 510. In addition, measurement of the illumination disk also permits evaluation of a BFA at 512. For example, a non-circular CPB illumination disk can be associated with degradation of the BFA, and if degradation is detected, the BFA can be replaced.

Figure 5B:
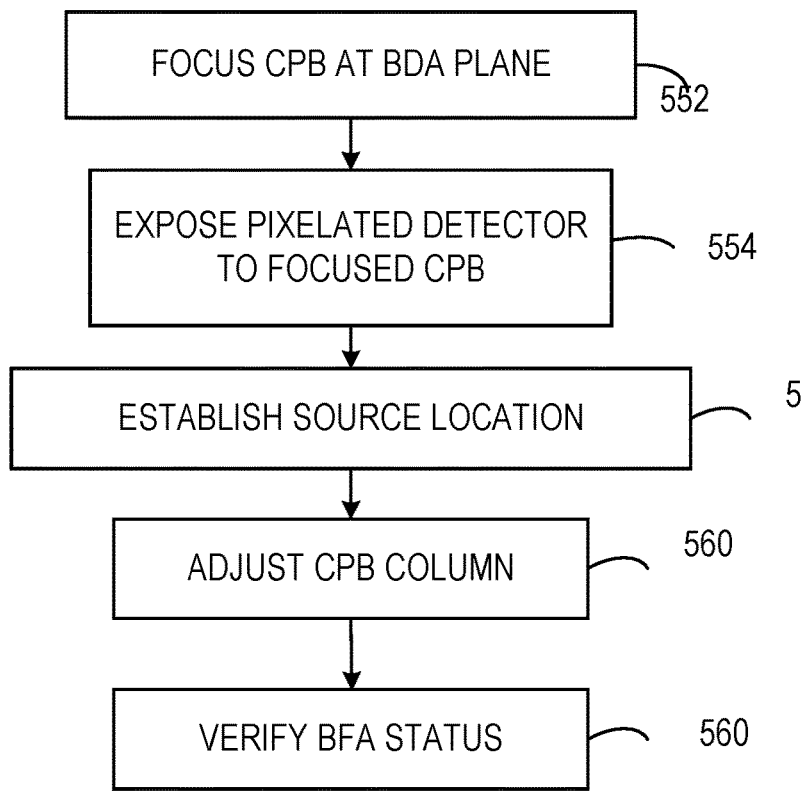
FIG. 5B illustrates an alignment method using a pixelated detector.

In another example shown in FIG. 5B, a method 550 includes focusing a CPB at or near a BDA plane at 552 and exposing a pixelated CPB detector to the focused beam at 554. At 556, CPB source location can be determined based on a beam image provided by the pixelated CPB detector. The CPB column can be adjusted at 560 to establish an intended beam position, and the image data used to assess the BFA at 562. Using a pixelated detector, alignment can be performed based on an illumination disk as well, and with a pixelated detector, aperture scanning may not be required. In addition, alignment can also be performed by scanning the alignment aperture with respect to a focused CPB and not only with an illumination disk.

Alignment Assembly with Internal Photodetector

Figure 6:
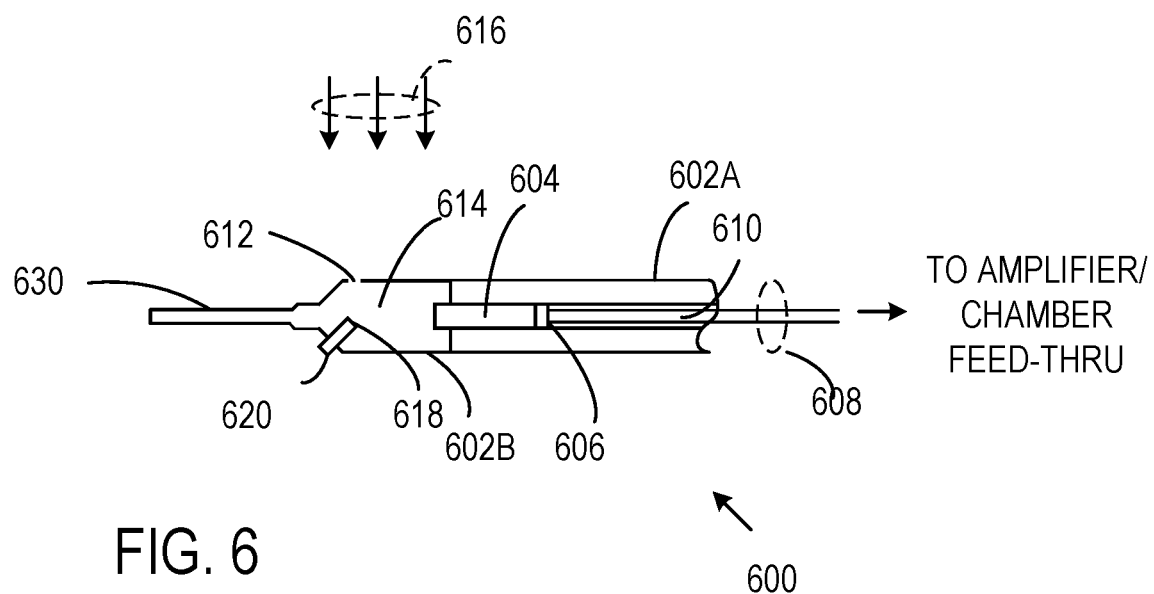
FIG. 6 illustrates a representative alignment apparatus that includes a photodetector.

Referring to FIG. 6, an alignment apparatus 600 for a CPB system includes a support member shown as a rod that includes an outer portion 602A and an inner portion 602B. The portion 602A retains a scintillator material 604 and a photodetector 606 that are optically coupled. The photodetector is electrically connected via conductors 608 situated in a cavity 610 in the portion 602A that communicate photosignals to a suitable amplifier that is typically external to a vacuum into which the alignment apparatus 600 extends. In this example, the scintillator material 604 is shown as elongated and so that a portion can serve as a light guide to deliver scintillation light to the photodetector 606. The portion 602B defines an aperture 612 into a cavity 614 so that portions of a CPB 616 can be transmitted to a secondary emission surface 618 defined on a secondary emission element 620. If convenient, the portion 602B can include a mounting portion 630 to which a beam defining aperture plate can be secured. The alignment apparatus 600 can be coupled to a positioning stage so that the alignment aperture is movable with respect to the CPB 616. The portions 602A, 60B can be secured together with adhesive or fasteners such as screws or rivets.

REPRESENTATIVE EXAMPLES

Example 1 is a charged particle beam alignment apparatus, including: an alignment aperture plate defining an alignment aperture; a secondary emission element situated to receive a portion of a CPB transmitted by the alignment aperture and operable to produce secondary emission in response; a scintillator element situated to receive at least a portion of the secondary emission and produce scintillation light in response; and a photodetector situated to receive the scintillation light produced at the scintillator element.

Example 2 includes the subject matter of Example 1, and further includes an aperture plate fixed to a support member and defining at least one beam defining aperture.

Example 3 includes the subject matter of any of Examples 1-2, and further includes a support member having an inner end and an outer end, wherein the alignment aperture plate is secured to the support member and is situated at the inner end of the support member.

Example 4 includes the subject matter of any of Examples 1-3, and further includes a light guide situated to receive the scintillation light produced at the scintillator element and direct the scintillation light to the photodetector.

Example 5 includes the subject matter of any of Examples 1-4, wherein the light guide is an elongated cavity defined in a support member and the scintillator element is situated at an entrance end of the light guide.

Example 6 includes the subject matter of any of Examples 1-5, and further specifies that the light guide is dielectric lightguide having an entrance end facing the scintillator element.

Example 7 includes the subject matter of any of Examples 1-6, and further specifies that the secondary emission element is situated on an axis perpendicular to the alignment aperture plate and tilted at an angle of between 10 degrees and 80 degrees away from the scintillator element.

Example 8 includes the subject matter of any of Examples 1-7, and further includes a support member is rod-shaped and extends along an axis and comprises a first conductive section situated at an interior end and an insulator section coupled to the first conductive section, wherein the first conductive section includes an alignment aperture and the secondary emission element and the insulator section defines an insulator cavity extending along the axis, wherein a light guide is situated in the insulator cavity.

Example 9 includes the subject matter of any of Examples 1-8, and further specifies that the support member includes a second conductive section coupled to the insulator section and defining a conductive cavity extending along the axis, wherein the light guide is situated in the conductive cavity.

Example 10 includes the subject matter of any of Examples 1-9, and further specifies that the second conductive section extends through the insulator cavity and is electrically coupled to the scintillator element.

Example 11 includes the subject matter of any of Examples 1-10, and further includes a translation feedthrough coupled to the second conductive section and operable to vary a position of the alignment aperture with respect to a CPB axis.

Example 12 includes the subject matter of any of Examples 1-11, and further specifies that the scintillator element includes a conductive coating.

Example 13 includes the subject matter of any of Examples 1-12, and further includes: a controller; and an actuator, wherein the controller is coupled to the actuator to move the alignment aperture with respect to a CPB axis and determine an offset of the alignment aperture with respect to the CPB axis based on the scintillation light received by the photodetector.

Example 14 includes the subject matter of any of Examples 1-13, and further specifies that the controller is coupled to a CPB optical column to adjust at least one of a CPB axis and a beam defining aperture based on the determined offset of the alignment aperture.

Example 15 is a method, including: scanning an alignment aperture with respect to a CPB; producing scintillation light at a scintillator member in response to a transmitted portion of the CPB; and determining a CPB axis based on the scintillation light.

Example 16 includes the subject matter of Example 15, and further includes capturing at least a portion of the scintillation light in a light guide wherein the determining the CPB axis is based on of the scintillation light.

Example 17 includes the subject matter of any of Examples 15-16, and further specifies that the transmitted portion of the CPB is incident to a secondary emission member to produce secondary emission so that the scintillation light is produced in response to the secondary emission, and further includes adjusting at least one of a CPB axis and a beam defining aperture based on the determined CPB axis.

Example 18 includes the subject matter of any of Examples 15-17, and further specifies that the alignment aperture and a beam defining aperture are secured to a rod-shaped member that is coupled to an actuator that translates the alignment aperture.

Example 19 is a CPB apparatus, including: a vacuum enclosure; a CPB source situated in the vacuum enclosure and operable to produce a CPB; a CPB optical system situated direct the CPB along a CPB axis; a CPB alignment apparatus extending into the vacuum enclosure, wherein the CPB alignment apparatus includes: a beam limiting aperture plate defining a beam limiting aperture; an alignment aperture plate defining an alignment aperture fixed with respect the beam limiting aperture plate; a secondary emission member situated to receive portions of the CPB transmitted by the alignment aperture; and a scintillator member situated to receive secondary emission from the secondary emission member and produce scintillation light; a mechanical vacuum feed through coupled to the CPB alignment apparatus and operable to move at least the alignment aperture with respect to a CPB axis; and a controller coupled to the mechanical vacuum feed through and a photodetector system and operable to direct the mechanical vacuum feed through to move the alignment aperture with respect to the CPB axis and based on a portion of the scintillation light, determine a CPB position.

Example 20 includes the subject matter of Example 19, and further specifies that the CPB alignment apparatus includes a rod-shape support member that comprises: an inner section conductive section that includes the beam limiting aperture plate, the alignment aperture plate, the secondary emission member, and the scintillator member; an intermediate insulator section defining a cavity in which a light guide is situated to extend toward the scintillator member; and an outer section coupled to the mechanical vacuum feed through, wherein the light guide extends to the scintillator member through the vacuum enclosure.

In view of the many possible embodiments to which the principles of the disclosure may be applied, it should be recognized that the illustrated embodiments are only preferred examples and should not be taken as limiting the scope of the disclosure.

We claim:

1. A charged particle beam (CPB) alignment apparatus, comprising:
    an alignment aperture plate defining an alignment aperture;
    a secondary emission element situated to receive a portion of a CPB transmitted by the alignment aperture and operable to produce secondary emission in response;
    a scintillator element situated to receive at least a portion of the secondary emission and produce scintillation light in response; and
    a photodetector situated to receive the scintillation light produced at the scintillator element,
    wherein the alignment aperture is moveable so as to receive the charged particle beam so that the scintillation light is detected by the photodetector, whereby an axis of the charged particle beam may be located.

2. The charged particle beam alignment apparatus of claim 1, further comprising an aperture plate fixed to a support member and defining at least one beam defining aperture.

3. The charged particle beam alignment apparatus of claim 1, further comprising a support member having an inner end and an outer end, wherein the alignment aperture plate is secured to the support member and is situated at the inner end of the support member.

4. The charged particle beam alignment apparatus of claim 1, further comprising a light guide situated to receive the scintillation light produced at the scintillator element and direct the scintillation light to the photodetector.

5. The charged particle beam alignment apparatus of claim 4, wherein the light guide is an elongated cavity defined in a support member and the scintillator element is situated at an entrance end of the light guide.

6. The charged particle beam alignment apparatus of claim 5, wherein the light guide is dielectric lightguide having an entrance end facing the scintillator element.

7. The charged particle beam alignment apparatus of claim 1, wherein the secondary emission element is situated on an axis perpendicular to the alignment aperture plate and tilted at an angle of between 10 degrees and 80 degrees away from the scintillator element.

8. The charged particle beam alignment apparatus of claim 1, further comprising a rod-shaped support member that extends along an axis and comprises a first conductive section situated at an interior end and an insulator section coupled to the first conductive section, wherein the first conductive section includes the alignment aperture and the secondary emission element and the insulator section defines an insulator cavity extending along the axis, wherein a light guide is situated in the insulator cavity.

9. The charged particle beam alignment apparatus of claim 8, wherein the support member includes a second conductive section coupled to the insulator section and defining a conductive cavity extending along the axis, wherein the light guide is situated in the conductive cavity.

10. The charged particle beam alignment apparatus of claim 9, wherein the second conductive section extends through the insulator cavity and is electrically coupled to the scintillator element.

11. The charged particle beam alignment apparatus of claim 10, further comprising a translation feedthrough coupled to the second conductive section and operable to vary a position of the alignment aperture with respect to a CPB axis.

12. The charged particle beam alignment apparatus of claim 1, wherein the scintillator element includes a conductive coating.

13. The charged particle beam alignment apparatus of claim 1, further comprising:
    a controller; and
    an actuator, wherein the controller is coupled to the actuator to move the alignment aperture with respect to a CPB axis and determine an offset of the alignment aperture with respect to the CPB axis based on the scintillation light received by the photodetector.

14. The charged particle beam alignment apparatus of claim 13, wherein the controller is coupled to a CPB optical column to adjust at least one of a CPB axis and a beam defining aperture based on the determined offset of the alignment aperture.

15. A method, comprising:
scanning an alignment aperture with respect to a charged particle beam (CPB);
producing scintillation light at a scintillator member in response to a portion of the CPB transmitted by the alignment aperture, the scintillator member situated to receive secondary emission produced by a secondary emission element situated to receive a portion of the CPB transmitted by the alignment aperture;
detecting the scintillation light produced by the scintillator member with a photodetector situated to receive the scintillation light;
determining a CPB axis based on the detected scintillation light; and
adjusting at least one of a CPB axis and a beam defining aperture based on the determined CPB axis.

16. The method of claim 15, further comprising capturing at least a portion of the scintillation light in a light guide that directs the scintillation light to the photodetector.

17. The method of claim 15, further comprising adjusting the beam defining aperture based on the determined CPB axis.

18. The method of claim 15, wherein the alignment aperture and a beam defining aperture are secured to a rod-shaped member that is coupled to an actuator that translates the alignment aperture.

19. A charged particle beam (CPB) apparatus, comprising:
a vacuum enclosure;
a CPB source situated in the vacuum enclosure and operable to produce a CPB;
a CPB optical system situated to direct the CPB along a CPB axis;
a CPB alignment apparatus extending into the vacuum enclosure, wherein the CPB alignment apparatus includes:
a beam limiting aperture plate defining a beam limiting aperture;
an alignment aperture plate defining an alignment aperture fixed with respect the beam limiting aperture plate;
a secondary emission member situated to receive portions of the CPB transmitted by the alignment aperture; and
a scintillator member situated to receive secondary emission from the secondary emission member and produce scintillation light;
a mechanical vacuum feed through coupled to the CPB alignment apparatus and operable to move at least the alignment aperture with respect to a CPB axis; and
a controller coupled to the mechanical vacuum feed through and a photodetector system and operable to direct the mechanical vacuum feed through to move the alignment aperture with respect to the CPB axis and, based on a portion of the scintillation light, determine a CPB position.

20. The CPB apparatus of claim 19, wherein the CPB alignment apparatus includes a rod-shape support member that comprises:
an inner conductive section that includes the beam limiting aperture plate, the alignment aperture plate, the secondary emission member, and the scintillator member;
an intermediate insulator section defining a cavity in which a light guide is situated to extend toward the scintillator member; and
an outer section coupled to the mechanical vacuum feed through, wherein the light guide extends to the scintillator member through the vacuum enclosure.

* * * * *